(12) United States Patent
Tomaschko et al.

(10) Patent No.: US 11,870,369 B2
(45) Date of Patent: Jan. 9, 2024

(54) MICROELECTRONICS DEVICE AND METHOD FOR PRODUCING A MICROELECTRONICS DEVICE

(71) Applicant: Robert Bosch GmbH, Stuttgart (DE)

(72) Inventors: Jochen Tomaschko, Gaeufelden (DE); Christoph Kaiser, Reutlingen (DE); Timo Schary, Aichtal-Neuenhaus (DE); Daniel Monteiro Diniz Reis, Esslingen Am Neckar (DE)

(73) Assignee: ROBERT BOSCH GMBH, Stuttgart (DE)

( * ) Notice: Subject to any disclaimer, the term of this patent is extended or adjusted under 35 U.S.C. 154(b) by 322 days.

(21) Appl. No.: 17/230,364

(22) Filed: Apr. 14, 2021

(65) Prior Publication Data

US 2021/0328524 A1 Oct. 21, 2021

(30) Foreign Application Priority Data

Apr. 20, 2020 (DE) .................. 102020204969.6

(51) Int. Cl.
| | |
|---|---|
| *H02N 2/02* | (2006.01) |
| *H02N 2/00* | (2006.01) |
| *G02B 26/08* | (2006.01) |
| *G02B 26/10* | (2006.01) |
| *H10N 30/06* | (2023.01) |
| *H10N 30/87* | (2023.01) |

(52) U.S. Cl.
CPC ......... *H02N 2/028* (2013.01); *G02B 26/0833* (2013.01); *G02B 26/101* (2013.01); *H02N 2/22* (2013.01); *H10N 30/06* (2023.02); *H10N 30/87* (2023.02)

(58) Field of Classification Search
CPC .......... H02N 2/028; H02N 2/22; H10N 30/06; H10N 30/87; H10N 30/079; H10N 30/8542; H10N 30/8554; G02B 26/0858
See application file for complete search history.

(56) References Cited

U.S. PATENT DOCUMENTS

| | | | |
|---|---|---|---|
| 5,648,300 A * | 7/1997 | Nakayama | ............... G11B 9/14 |
| 2005/0116798 A1 * | 6/2005 | Bintoro | ............... F16K 99/0046 |
| | | | 335/78 |
| 2007/0164634 A1 * | 7/2007 | Yao | ..................... H10N 30/2043 |
| | | | 29/25.35 |
| 2010/0195180 A1 | 8/2010 | Akanuma et al. | |

* cited by examiner

*Primary Examiner* — Emily P Pham
(74) *Attorney, Agent, or Firm* — NORTON ROSE FULBRIGHT US LLP; Gerard Messina

(57) ABSTRACT

A microelectronics device, in particular a thin-film electronics device, having at least one bearer substrate and having at least one pyramidally layered, piezo stack situated on the bearer substrate, which stack has at least one piezo element and at least one electrode, in particular a floor electrode, and having at least one contact opening situated on the at least one electrode. The microelectronics device has a diffusion blocking element that is situated on the at least one electrode at least partly at a distance from the piezo element, and/or the contact opening forms a contact surface that is at most as large as one one-thousandth of a surface of the at least one piezo element, and/or a length of an electrical path from the at least one contact opening to the at least one piezo element corresponds to at least twice the circumference of the at least one contact opening.

13 Claims, 3 Drawing Sheets

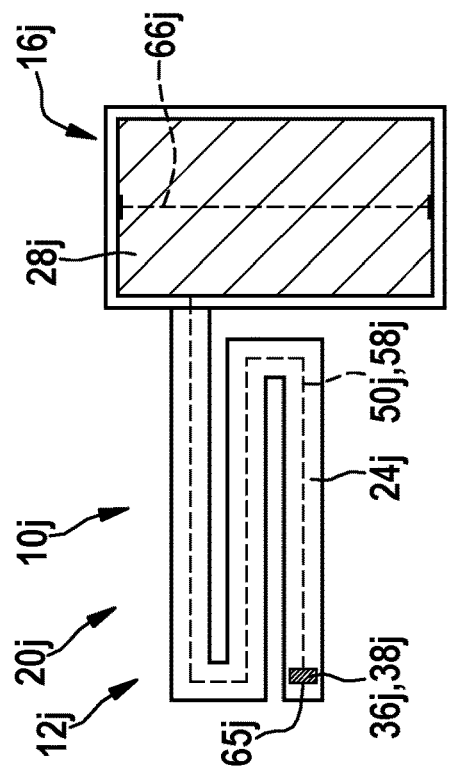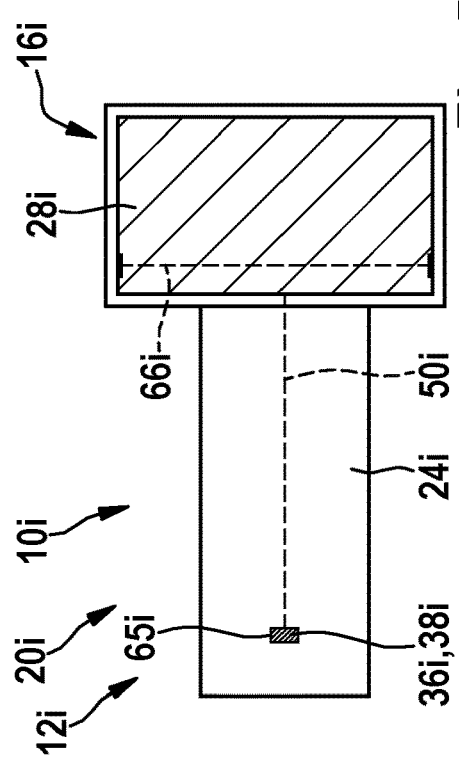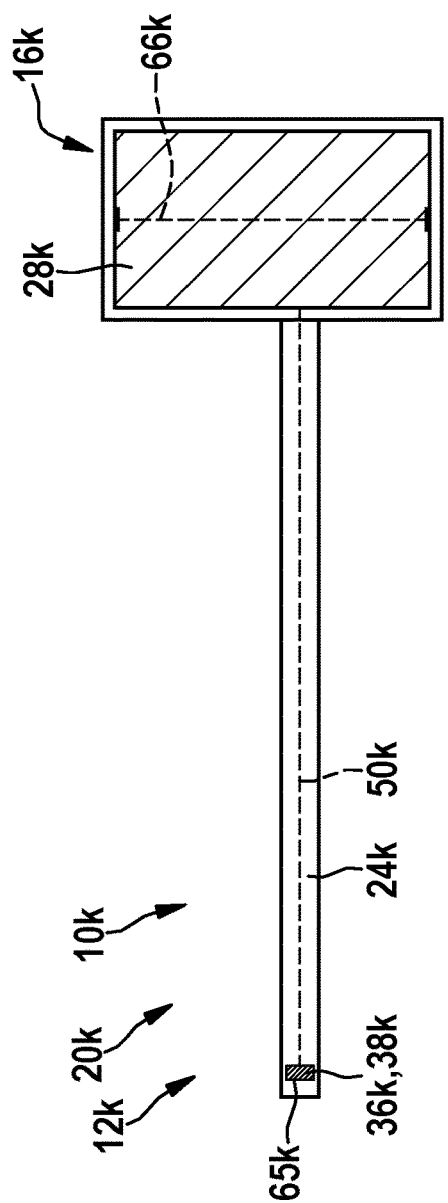

MICROELECTRONICS DEVICE AND METHOD FOR PRODUCING A MICROELECTRONICS DEVICE

CROSS REFERENCE

The present application claims the benefit under 35 U.S.C. § 119 of German Patent Application No. DE 102020204969.6 filed on Apr. 20, 2020, which is expressly incorporated herein by reference in its entirety.

BACKGROUND INFORMATION

A microelectronics device, in particular a thin-film electronics device having at least one bearer substrate and having at least one layered, in particular pyramidally layered, piezo stack situated on the bearer substrate, the stack having at least one piezo element and at least one electrode, in particular a floor electrode, and having at least one contact opening situated on the at least one electrode, has already been proposed.

SUMMARY

The present invention relates to a microelectronics device, in particular a thin-film electronics device, having at least one bearer substrate and having at least one layered, in particular pyramidally layered, piezo stack situated on the bearer substrate, the stack having at least one piezo element and at least one electrode, in particular a floor electrode, and having at least one contact opening situated on the at least one electrode.

In accordance with an example embodiment of the present invention, the microelectronics device has a diffusion blocking element that is situated on the at least one electrode at least partly at a distance from the piezo element, and/or that the contact opening form a contact surface that is at most as large as one one-thousandth of a surface of the at least one piezo element, and/or that a length of an electrical path from the at least one contact opening, in particular the contact surface, to the at least one piezo element correspond at least to twice the circumference of the at least one contact opening.

A "microelectronics device" is preferably to be understood as a thin-film electronics device, in particular on a bearer substrate, in particular a chip. In particular, the bearer substrate is formed by a silicon wafer, a silicon/silicon dioxide wafer, and/or a silicon/aluminum oxide wafer. Preferably, the microelectronics device is formed as a micromirror device, in particular as a MEMS scanner. Preferably, the microelectronics device has at least two axes about which the microelectronics device is made so as to be at least partly movable, preferably rotatable and/or pivotable. Preferably, the microelectronics device includes at least one slow axis and at least one fast axis, in particular for a movement and/or pivoting of a mirror element. Preferably, the microelectronics device includes at least one copper element, in particular at least one copper coil, which is provided to rotate and/or to pivot the microelectronics device at least partly about the slow, in particular quasi-static, axis, in particular in order to rotate and/or to pivot the mirror element of the microelectronics device at least partly about the slow axis. Preferably, the piezo element, in particular the piezo stack, is provided to rotate and/or to pivot the microelectronics device at least partly about the fast, in particular resonant, axis, in particular to rotate and/or to pivot the mirror element of the microelectronics device at least partly about the slow [sic] axis. "Provided" is to be understood in particular as meaning specifically programmed, designed, and/or equipped. The statement that an object is provided for a particular function is to be understood in particular as meaning that the object fulfills and/or carries out this particular function in at least one state of use and/or operating state. In particular, the piezo element is formed from a perovskite crystal, in particular perovskite ceramic, having a crystal structure AxBxO3, for example PZT, in particular Pb(Zr0.5, Ti0.5)O3, or KNN, in particular K(NaNi)O3. In particular, the piezo element can be doped, for example with Ni, La, and/or Nb.

In accordance with an example embodiment of the present invention, preferably, the at least one bearer substrate has at least one, in particular two, receptacle side(s). Preferably, a receptacle side of the bearer substrate is a side that has a largest, in particular contiguous, outer surface of the bearer substrate, and on which in particular the at least one piezo stack is situated. Preferably, a receptacle surface is the largest, in particular contiguous, outer surface of the receptacle side. Preferably, the microelectronics device is formed at least partly by a piezo stack that is deposited, in particular in layered fashion, on the bearer substrate. Preferably, the piezo stack includes at least one first electrode, in particular a floor electrode, that is in particular situated directly on the bearer substrate. The piezo stack can have at least one adhesive layer, in particular a titanium oxide layer, that is in particular situated directly on the bearer substrate. In particular, the at least one first electrode, in particular floor electrode, can be situated on the adhesive layer, in particular the titanium oxide layer, in particular in order to shield the at least one first electrode from the bearer substrate. Preferably, the at least one adhesive layer and the at least one first electrode each have equally large surfaces parallel to the receptacle surface. In particular, the at least one adhesive layer and the at least one first electrode are fashioned so as to be at least substantially congruent.

In accordance with an example embodiment of the present invention, preferably, the piezo stack has at least one seed layer, in particular an LNO layer, preferably an LaNiO3 layer, that is situated in particular directly on the first electrode, in particular floor electrode. Preferably, the at least one seed layer has a surface parallel to the receptacle surface that is smaller than a surface parallel to the receptacle surface of the at least one adhesive layer or the at least one first electrode. The at least one seed layer can have a surface parallel to the receptacle surface that is exactly as large as a surface parallel to the receptacle surface of the at least one adhesive layer or of the at least one first electrode, in particular of the floor electrode.

In accordance with an example embodiment of the present invention, preferably, the piezo stack has at least one piezo element, preferably a thin-film piezo element, in particular a PZT layer, preferably a KNN layer, that is situated in particular directly on the seed layer. Preferably, the at least one piezo element and the at least one seed layer each have equally large surfaces parallel to the receptacle surface. Preferably, the at least one piezo element has a surface parallel to the receptacle surface that is smaller than a surface parallel to the receptacle surface of the at least one adhesive layer or of the at least one first electrode. In accordance with an example embodiment of the present invention, preferably, a width of the piezo element is a largest extension of the at least one piezo element along a plane parallel to the receptacle surface, in particular of the bearer substrate.

In particular, the at least one seed layer and the at least one piezo element are made so as to be at least substantially congruent. Preferably, the at least one piezo element has a layer thickness that is at least as thick as the layer thickness of the adhesive layer, the first electrode, and the seed layer together. The seed layer can be fashioned as a barrier layer, in particular against a diffusion.

In accordance with an example embodiment of the present invention, preferably, the piezo stack includes at least one further electrode, in particular a top electrode, that is situated in particular directly on the piezo element. Preferably, the at least one further electrode, in particular top electrode, is situated on the piezo element facing away from the at least one bearer substrate. Preferably, the at least one first electrode, in particular floor electrode, is situated on the piezo element facing the at least one bearer substrate. The microelectronics device can have at least one barrier layer, in particular a tantalum nitride layer, titanium nitride layer, titanium layer, and/or tantalum layer, in particular against a diffusion, which barrier layer is situated in particular directly on the at least one further electrode. In particular, the at least one further electrode, in particular top electrode, can be passivated by the barrier layer, in particular for a shielding of the at least one further electrode against ambient air. Preferably, the at least one barrier layer and the at least one further electrode have equally large surfaces parallel to the receptacle surface. In particular, the at least one barrier layer and the at least one further electrode are fashioned so as to be at least substantially congruent. Preferably, the at least one barrier layer and the at least one further electrode each have a surface parallel to the receptacle surface that is smaller than a surface parallel to the receptacle surface of the at least one piezo element or of the at least one seed layer.

In accordance with an example embodiment of the present invention, preferably, all layers and/or electrodes and/or piezo elements of the piezo stack are fashioned as thin films. Preferably, the piezo stack is pyramidally layered. "Pyramidally layered" is preferably to be understood as meaning that an electrode or a piezo element of a stack, preferably a piezo stack, on a bearer substrate has in each case a smaller surface parallel to the receptacle surface of the piezo element than do all electrodes situated between the electrode or the piezo element, in particular piezo elements, in particular for an electrical contacting, oriented perpendicular to the receptacle surface, of the electrodes and/or piezo elements.

In accordance with an example embodiment of the present invention, preferably, the microelectronics device includes at least one passivation layer, in particular a silicon nitride layer and/or a lacquer layer. Preferably, the at least one passivation layer at least partly passivates the at least one first electrode and/or the at least one further electrode.

In accordance with an example embodiment of the present invention, preferably, for an electrical contacting of the at least one first and/or of the at least one further electrode, preferably of the floor electrode, the at least one passivation layer has a contact opening that is situated on a side facing away from the piezo element of the at least one diffusion blocking element and/or that is situated on a side facing away from the piezo element, in particular a side free of a piezo element, in particular a piezo-free end, of the at least one first electrode.

An "electrical path" is preferably to be understood as an electrically conductive connection. Preferably, the length of the electrical path from the at least one contact opening, in particular of the contact surface, to the at least one piezo element corresponds to at least twice, preferably at least three times, particularly preferably at least five times, quite particularly preferably at least seven times, in particular at least ten times, the circumference of the at least one contact opening. The "circumference" of the at least one contact opening, or at least one element, is preferably to be understood as the smaller of a mathematically summed smallest circumference of the contact opening, in particular in a plane of the receptacle surface, or of a smallest geometrical ellipse, in particular a smallest geometrical circle, that completely surrounds the contact opening, in particular in a plane of the receptacle surface. In particular, the circumference of the at least one contact opening can be a summed circumference of all contact openings.

In particular, the length of the electrical path from the at least one contact opening, in particular of the contact surface, to the at least one piezo element can correspond to at least twice, preferably at least three times, particularly preferably at least five times, particularly preferably at least seven times, in particular at least ten times, the maximum width of the at least one piezo element.

In particular, the length of the electrical path from the at least one contact opening, in particular the contact surface, to the at least one piezo element can correspond to at least one-twentieth, preferably at least one-fifteenth, particularly preferably at least one-tenth, particularly preferably at least one-fifth, in particular at least one half, of the circumference of the at least one piezo element.

Preferably, a "contact surface" that is formed by the at least one contact opening, in particular of the contact surface, is to be understood as a surface free of the passivation layer, in particular left open by the contact opening, of the at least one electrode, in particular floor electrode, that is oriented in particular parallel to the receptacle surface. The microelectronics device includes in particular the at least one diffusion blocking element, which is preferably fashioned so as to be at least partly, preferably completely, integrated into the at least one electrode.

Preferably, a smallest imaginary rectangular solid, which just completely surrounds the at least one electrode, encloses the at least one diffusion blocking element at least partly, preferably completely.

In accordance with an example embodiment of the present invention, preferably, the contact opening forms a contact surface that is in particular oriented parallel to the receptacle surface, and that is at most as large as one-twentieth, preferably one one-thousandth, preferably one two-thousandth, particularly preferably one five-thousandth, and quite particularly preferably one ten-thousandth, of a surface of the at least one piezo element that is in particular oriented parallel to the receptacle surface.

Through the realization according to example embodiments of the present invention of the microelectronics device, a probability, in particular a time span, of a diffusion of foreign atoms to the at least one piezo element can be advantageously reduced, in particular increased. In particular, an advantageously long-lasting microelectronics device can be fashioned that has in particular an advantageously diffusion-protected piezo ceramic, in particular piezo crystal, in particular perovskite crystal and/or perovskite ceramic. An effective diffusion path can be advantageously lengthened, in particular with savings of material.

In addition, in accordance with an example embodiment of the present invention, it is provided that the at least one diffusion blocking element be fashioned as an in particular slit-shaped opening. The at least one opening can be made at least partly angled. In particular, the at least one opening can have, an outer contour that is at least substantially rectangular through the at least one electrode. Preferably, the at least one diffusion blocking element is fashioned as an opening that forms an indentation of the at least one electrode, preferably floor electrode. Preferably, the at least one diffusion blocking element is situated at least partly on at least one outer edge of the at least one electrode, preferably floor electrode. Preferably, the at least one diffusion blocking element is situated at least partly on at least two outer edges of the at least one electrode, preferably floor electrode. Preferably, the at least one diffusion blocking element is situated at least partly on at least three outer edges of the at least one electrode, preferably floor electrode. An advantageous diffusion block can be formed from the at least one contact opening, in particular the contact surface, to the at least one piezo element. In particular, an effective diffusion path along the at least one electrode, preferably floor electrode, particularly preferably from the at least one contact opening, in particular of the contact surface, to the at least one piezo element can be advantageously lengthened. An advantageous time delay of a diffusion current through the electrode can be achieved.

In addition, in accordance with an example embodiment of the present invention, it is provided that the at least one diffusion blocking element be fashioned as a diffusion absorbing element. Preferably, the diffusion blocking element is fashioned as a diffusion absorbing element that is provided in order to bind atoms, molecules, and/or ions, in particular oxygen atoms, molecules, and/or ions, fluorine atoms, molecules, and/or ions, and/or hydrogen atoms, molecules, and/or ions, in particular through chemical reactions. Preferably, the at least one diffusion blocking element is made of a material that is made more reactive, in particular chemically less noble, than a material from which the at least one electrode is made, in particular of Zr, Ti, Hf, Ta, Nb, Th, alloys of the named elements, and/or elements of the fourth or fifth main group of a periodic system. Preferably, the at least one electrode is at least partly made of a noble metal, for example platinum, gold, iridium, and/or silver. In particular, the at least one diffusion blocking element can be made at least partly of an alkali metal and/or earth alkali metal. In particular, the at least one diffusion blocking element can be formed at least partly as an opening in which at least one diffusion absorbing element is situated. In particular, the at least one diffusion blocking element can be situated on an external side of the at least one electrode, preferably floor electrode. An advantageously active diffusion protection can be achieved that in particular combines an advantageously compact microelectronics device with advantageous long useful life of the microelectronics device. An advantageously exchangeable diffusion blocking element can be achieved that in particular makes a useful life of the microelectronics device capable of being prolonged, advantageously for a user. An advantageous attenuation of a diffusion current through the electrode can be achieved.

In addition, in accordance with an example embodiment of the present invention, it is provided that at least two diffusion blocking elements at a distance from one another be situated on the at least one electrode. Preferably, the at least two diffusion blocking elements are situated between the contact opening and the at least one piezo element. Preferably, the at least two diffusion blocking elements are situated at least partly on an imaginary shortest axis of connection of the at least one piezo element and the at least one contact surface, in particular contact opening. In particular, on the at least one electrode there are situated at least two diffusion blocking elements configured offset from one another along a longitudinal axis of the at least one electrode. Preferably, a "longitudinal axis" of an object is to be understood as an axis that runs parallel to a longest edge of a smallest geometrical rectangular solid that just encloses the object. Advantageously and at low cost, a probability of diffusion from the at least one contact opening, in particular the contact surface, to the at least one piezo element can be achieved.

In addition, in accordance with an example embodiment of the present invention, it is provided that the at least two diffusion blocking elements form the electrical path in the manner of a labyrinth. Preferably, the at least two diffusion blocking elements are configured so as to form a shortest electrical path that is curved, angled, and/or not straight, in particular from the at least one contact surface to the at least one piezo element. In particular, at least one diffusion blocking element can be situated so as to be at least partly, in particular completely, sheathed by the at least one electrode. Preferably, on the at least one electrode there is situated a multiplicity of for example three, four, five, six, eight, ten, or the like, diffusion blocking elements. Preferably, the electrical path, in particular from the at least one contact opening, in particular the contact surface, to the at least one piezo element, is made having multiple deflections through a multiplicity of diffusion blocking elements on and/or in the at least one electrode. An advantageous lengthening of a diffusion path, in particular an electrical path, can be achieved, which advantageously has a small influence on an electrical resistance of the at least one electrode. In particular, advantageous electrical power characteristics can be combined with advantageously reduced diffusion characteristics of the electrode.

In addition, in accordance with an example embodiment of the present invention, it is provided that the at least one diffusion blocking element extend perpendicular to a receptacle surface of the bearer substrate, through at least 50% of the at least one electrode. Preferably, the at least one diffusion blocking element extends perpendicular to the receptacle surface of the bearer substrate through at least 60%, preferably through at least 70%, particularly preferably through at least 90%, of the at least one electrode. Quite particularly preferably, the at least one diffusion blocking element extends perpendicular to the receptacle surface of the bearer substrate completely through the at least one electrode. Preferably, the at least one diffusion blocking element extends within a plane parallel to the receptacle surface of the bearer substrate, in particular perpendicular to the connecting axis and/or perpendicular to the longitudinal axis of the electrode, through at least 25%, preferably through at least 50%, particularly preferably through at least 75%, of the at least one electrode. The at least one diffusion blocking element can extend within a plane parallel to the receptacle surface of the bearer substrate, in particular perpendicular to the connecting axis and/or perpendicular to the longitudinal axis of the electrode, completely through the electrode, in particular in order to divide the electrode into two regions separated from one another. An advantageous diffusion block within the at least one electrode can be achieved with an advantageously intact electrical connection of the contact surface to the piezo element through the electrode.

In addition, in accordance with an example embodiment of the present invention, it is provided that the at least one diffusion blocking element be made at least partly of the same material as the at least one piezo element. Preferably, the at least one diffusion blocking element is made at least partly of a perovskite material, in particular KNN material and/or PZT material. An advantageous protection of the at least one piezo element can be achieved, in particular because the at least one diffusion blocking element can catch, preferably bind, undesired diffusion atoms instead of the piezo element.

In addition, in accordance with an example embodiment of the present invention, it is provided that the at least one diffusion blocking element be made at least partly rounded. Preferably, the at least one diffusion element, viewed from the at least one contact opening, is made at least partly concave. Preferably, two diffusion blocking elements are situated at a level along the connecting axis, and in particular define an electrical path opening between the two diffusion blocking elements. Preferably, at least one diffusion element, viewed from the at least one contact opening, is made at least partly convex. Preferably, at least one diffusion element that, viewed from the at least one contact opening, is made at least partly convex, is situated at least partly on the connecting axis, in particular between the path opening and the contact opening, in particular the contact surface. A particularly advantageous geometrical diffusion barrier can be achieved that in particular realizes advantageous diverting characteristics for diffusion atoms.

In addition, in accordance with an example embodiment of the present invention, it is provided that the electrical path be longer than a minimum geometrical distance of the at least one contact opening, in particular contact surface, to the at least one piezo element. Preferably, the length of the electrical path from the at least one contact opening, in particular the contact surface, to the at least one piezo element corresponds to at least twice, preferably at least three times, particularly preferably at least five times, particularly preferably at least seven times, the geometrical distance of the at least one contact opening, in particular contact surface, to the at least one piezo element. An advantageously dimensionable piezo element can be used. In particular, an advantageously low-cost reduction of the diffusion probability can be achieved.

In addition, in accordance with an example embodiment of the present invention, a method is provided for producing a microelectronics device according to the present invention. In at least one method step, at least one diffusion blocking element at least partly at a distance from the piezo element can be situated on the at least one electrode. In at least one method step, the contact opening can be formed having a contact surface that is at most as large as one one-thousandth of a surface of the at least one piezo element that is in particular oriented parallel to the receptacle surface. In at least one method step, the length of the electrical path from the at least one contact opening, in particular the contact surface, to the at least one piezo element can be made to correspond to at least twice the circumference of the at least one contact opening. A production method for the at least one microelectronics device can be achieved that is advantageously suitable for mass production.

The microelectronics device according to the present invention and/or the method according to the present invention are not intended to be limited to the application and specific embodiments described herein. In particular, the microelectronics device and/or the method according to the present invention can have, in order to realize a manner of functioning described herein, a number of individual elements, components, and units, as well as method steps, differing from a number named herein. In addition, for the value ranges indicated in the present disclosure, values lying within the named limits are also to be considered as disclosed and usable as desired.

BRIEF DESCRIPTION OF THE DRAWINGS

Further advantages result from the following description of the figures. The figures show eleven exemplary embodiments of the present invention. The figures and the description herein contain numerous features in combination. The person skilled in the art will usefully also regard the features individually and combine them to form appropriate further combinations, in view of the present disclosure.

DETAILED DESCRIPTION OF EXAMPLE EMBODIMENTS

Figure 1:
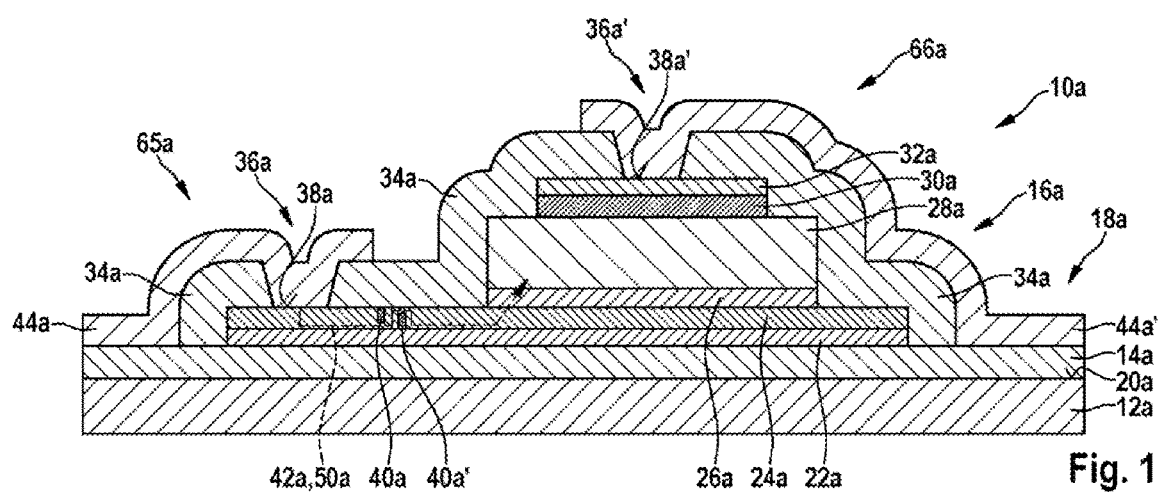
FIG. 1 shows a microelectronics device according to an example embodiment of the present invention in a schematic representation.

FIG. 1 shows a microelectronics device 10a, in particular a thin-film electronics device. Microelectronics device 10a includes at least one bearer substrate 12a, in particular a silicon wafer. A CMOS substructure 14a, in particular microelectronics device 10a, is situated, in particular deposited, on, in particular onto, bearer substrate 12a.

Microelectronics device 10a includes a pyramidally layered piezo stack 16a. Piezo stack 16a is situated on bearer substrate 12a, in particular on CMOS substructure 14a.

Bearer substrate 12a has a receptacle side 18a on which in particular piezo stack 16a is situated. In particular, receptacle side 18a has a receptacle surface 20a.

Piezo stack 16a includes an adhesive layer 22a, in particular a titanium oxide layer, which is situated in particular directly on bearer substrate 12a.

Piezo stack 16a includes a first electrode, in particular floor electrode 24a, which is situated in particular directly on adhesive layer 22a. Piezo stack 16a includes at least one seed layer 26a, in particular an LNO layer, preferably an LaNiO3 layer, which is situated in particular directly on the first electrode, in particular floor electrode 24a. Piezo stack 16a includes a piezo element 28a, in particular a thin-film piezo element, which is in particular situated directly on seed layer 26a.

Piezo stack 16a includes a further electrode, in particular top electrode 30a, which is situated in particular directly on piezo element 28a. Top electrode 30a, in particular floor electrode 24a, is made of platinum, gold, iridium, and/or silver.

Microelectronics device 10a has a barrier layer 32a, in particular a tantalum nitride layer, in particular against a diffusion, which is situated in particular directly on the at least one top electrode 30a. Barrier layer 32a can in particular be formed from a combination of tantalum, tantalum nitride, titanium, and/or titanium nitride. In particular, top electrode 30a is passivated, in particular by barrier layer 32a, in particular in order to shield the at least one top electrode 30a from ambient air.

The components, in particular all layers and/or electrodes and/or piezo elements 28a, of piezo stack 16a are formed as thin films, in particular as layers having maximum layer thicknesses of less than 5 μm, preferably less than 2-3 μm, particularly preferably less than 1 μm.

Piezo stack 16a, in particular the layers and/or electrodes and/or piezo elements 28a of piezo stack 16a, is/are pyramidally layered.

Microelectronics device 10a includes a passivation layer 34a, in particular a silicon nitride layer and/or a lacquer layer. Passivation layer 34a passivates floor electrode 24a and/or top electrode 30a, in each case partly on bearer substrate 12a, in particular on CMOS substructure 14a.

Microelectronics device 10a has two diffusion blocking elements 40a, 40a'. Two diffusion blocking elements 40a, 40a', at a distance from piezo element 28a, are situated on floor electrode 24a.

Passivation layer 34a limits a contact opening 36a, for an electrical contacting of the at least one floor electrode 24a. Contact opening 36a is situated on floor electrode 24a. Contact opening 36a is situated on a side of the at least one diffusion blocking element 40a facing away from piezo element 28a.

Passivation layer 34a limits a contact opening 36a', for an electrical contacting of the at least one top electrode 30a. Contact opening 36a is situated on top electrode 30a. Contact opening 36a' is situated on a side of top electrode 30a facing away from piezo element 28a.

Diffusion blocking elements 40a, 40a' are provided in order to lengthen an effective diffusion path 42a from contact opening 36a to piezo element 28a through floor electrode 24a.

Floor electrode 24a is electrically connected to a surrounding wiring 44a, in particular made of aluminum, copper, Ta, TaN, Ti, and/or TiN, through contact opening 36a.

Top electrode 30a is electrically connected to a surrounding wiring 44a', in particular made of aluminum and/or copper, Ta, TaN, Ti, and/or TiN, through contact opening 36a'.

Contact opening 36a forms a contact surface 38a. Contact surface 38a is a part of a surface of one of the electrodes, in particular of floor electrode 24a. Contact surface 38a is oriented parallel to receptacle surface 20a.

Contact opening 36a' forms a contact surface 38a'. Contact surface 38a' is a part of a surface of one of the electrodes, in particular of top electrode 30a. Contact surface 38a' is oriented parallel to receptacle surface 20a.

An electrical path 50a is longer than a minimum geometrical distance of the at least one contact opening 36a to the at least one piezo element 28a.

A method for producing microelectronics device 10a includes, for example, a diffusion blocking step, in which on the at least one electrode, in particular floor electrode 24a, there can be situated at least one diffusion blocking element 40a, 40a' at least partly at a distance from piezo element 28a.

In at least one method step, in particular the diffusion blocking step, contact opening 36a can be formed having a contact surface 38a that is at most as large as one one-thousandth, in particular one five-thousandth, of a surface of the at least one piezo element 28a that is oriented in particular parallel to receptacle surface 20a.

In at least one method step, in particular the diffusion blocking step, the length of electrical path 50a from the at least one contact opening 36a, in particular contact surface 38a, to the at least one piezo element 28a can be correspondingly fashioned as at least twice the circumference 65a of the at least one contact opening 36a, in particular at least a maximum width 66a of the at least one piezo element 28a.

Electrical path 50a runs in particular through an electrode, in particular through floor electrode 24a.

FIGS. 2a through 4c show further exemplary embodiments of the present invention. The following descriptions and the figures are substantially limited to the differences between the exemplary embodiments; with regard to identically designated components, in particular components having identical reference characters, in principle reference can also be made to the figures and/or the description of the other exemplary embodiments, in particular FIG. 1. In order to distinguish the exemplary embodiments, the letter a has been appended to the reference characters of the exemplary embodiment in FIG. 1. In the exemplary embodiments of FIGS. 2a through 4c, the letter a is replaced by the letters b through k.

In particular, for simplification in FIGS. 2a through 4c, in particular in FIGS. 2a through 4c, only the floor electrode, the piezo element, the contact opening, the contact surface, and the diffusion blocking element(s) are shown, and in this set reference characters are omitted for clarity.

Figures 2A, 2C:
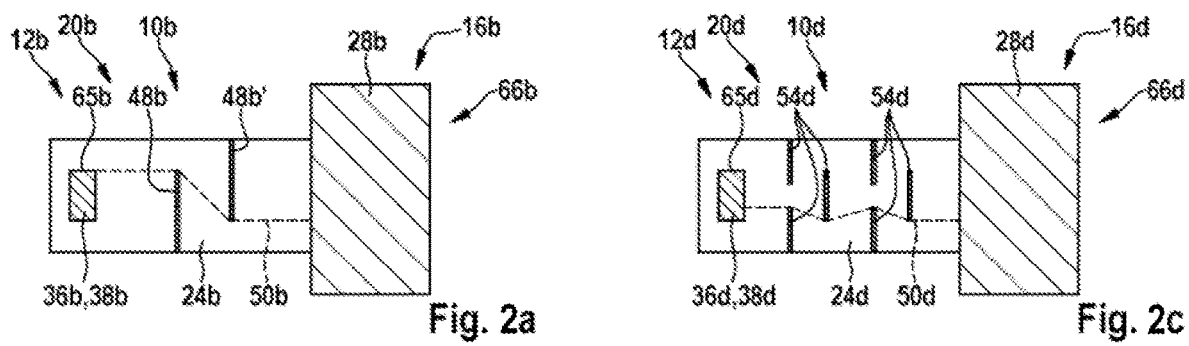
FIGS. 2a-2d show overviews of alternative microelectronics devices according to example embodiments of the present invention, in a schematic representation.

FIG. 2a schematically shows an alternative microelectronics device 10b, in particular in a view along a surface normal of a receptacle surface 20b of a bearer substrate 12b.

Two diffusion blocking elements 48b, 48b' at a distance from one another are situated on an electrode, in particular on an electrode 24b. Microelectronics device 10b has the two diffusion blocking elements 48b, 48b'. Diffusion blocking elements 48b, 48b' are fashioned as in particular slit-shaped openings. Diffusion blocking elements 48b, 48b' are situated on sides facing away from one another of floor electrode 24b. Diffusion blocking elements 48b, 48b' run parallel to an outer edge of floor electrode 24b, in particular of piezo element 28b.

Diffusion blocking elements 48b, 48b' extend perpendicular to a receptacle surface 20b of bearer surface 12b, through at least 50% of the electrode, in particular floor electrode 24b. Diffusion blocking elements 48b, 48b' extend perpendicular to receptacle surface 20b of bearer surface 12b through the entire floor electrode 24b. Diffusion blocking elements 48b, 48b' extend in a plane of receptacle surface 20b of bearer substrate 12b through at least 50%, in particular at least 70%, of the electrode, in particular floor electrode 24b.

The two diffusion blocking elements 48b, 48b' form an electrical path 50b in a labyrinthine manner. Electrical path 50b in particular connects a contact surface 38b to piezo element 28b. Electrical path 50b is longer than a minimum geometrical distance of the at least one contact opening 36b to the at least one piezo element 28b.

Figures 2B, 2D:
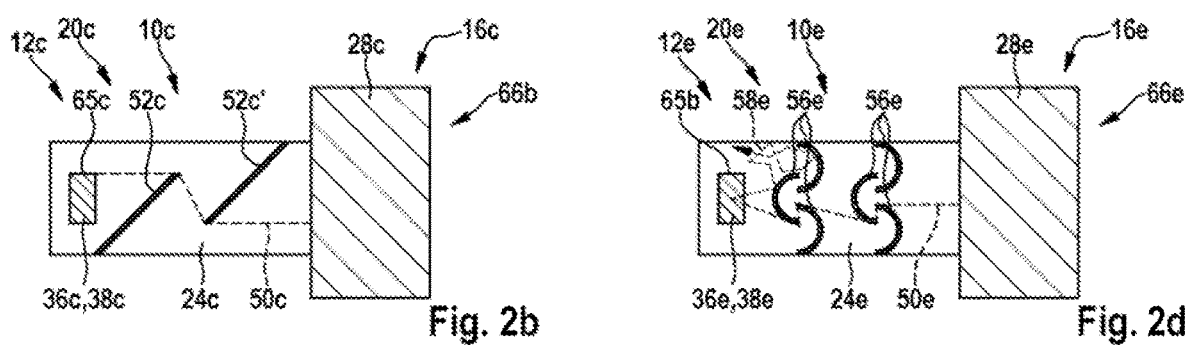

FIG. 2b schematically shows an alternative microelectronics device 10c.

Two diffusion blocking elements 52c, 52c' at a distance from one another are situated on an electrode, in particular on a floor electrode 24c. Microelectronics device 10c has the two diffusion blocking elements 52c, 52c'. Diffusion blocking elements 52c, 52c' are formed as in particular slit-shaped openings. Diffusion blocking elements 52c, 52c' are situated on sides of floor electrode 24c facing away from one another. Diffusion blocking elements 52c, 52c' run at an angle to an outer edge of floor electrode 24c, in particular of piezo element 28c. Diffusion blocking elements 52c, 52c' are configured parallel to one another.

Diffusion blocking elements 52c, 52c' extend perpendicular to a receptacle surface 20c of a bearer substrate 12c, through at least 50% of the electrode, in particular floor electrode 24c. Diffusion blocking elements 52c, 52c' extend perpendicular to receptacle surface 20c of bearer substrate 12c, through the entire floor electrode 24c. Diffusion blocking elements 52c, 52c' extend in a plane of receptacle surface 20c of bearer substrate 12c, through at least 50%, in particular at least 70%, of the electrode, in particular floor electrode 24c.

The two diffusion blocking elements 52c, 52c' form an electrical path 50c in a labyrinthine manner.

FIG. 2c schematically shows an alternative microelectronics device 10d.

Six diffusion blocking elements 54d at a distance from one another are situated on electrode, in particular on a floor electrode 24d. Microelectronics device 10d has diffusion blocking elements 54d. Diffusion blocking elements 54d are fashioned as in particular slit-shaped openings. Diffusion blocking elements 54d are situated partly on sides of floor electrode 24d facing away from one another, in particular and/or partly centrically in floor electrode 24d. Diffusion blocking elements 54d on floor electrode 24d run parallel to an outer edge of floor electrode 24d. Four of the six diffusion blocking elements 54d form respective oppositely situated pairs on floor electrode 24d, in order to form an electrical path 50d that runs centrically through floor electrode 24d. Two of the six diffusion blocking elements 54d are each situated centrically on floor electrode 24d in order to block a direct electrical, in particular diffusive, path 50d that runs centrically through floor electrode 24d.

Diffusion blocking elements 54d extend perpendicular to a receptacle surface 20d of bearer substrate 12d, through at least 50% of the electrode, in particular floor electrode 24d. Diffusion blocking elements 54d extend perpendicular to receptacle surface 20d of bearer substrate 12d, through the entire floor electrode 24d. Diffusion blocking elements 54d extend in a plane of receptacle surface 20d of bearer substrate 12d, through at least 40% of the electrode, in particular floor electrode 24d.

Diffusion blocking elements 54d form electrical path 50, in particular through floor electrode 24c, in a labyrinthine manner.

FIG. 2d schematically shows an alternative microelectronics device 10e.

Six diffusion blocking elements 56e at a distance from one another are situated on an electrode, in particular on a floor electrode 24e. Microelectronics device 10e has the six diffusion blocking elements 56e. Diffusion blocking elements 56e are fashioned as in particular slit-shaped openings. Diffusion blocking elements 56e are made at least partly rounded. Diffusion blocking elements 56e are partly situated on sides of floor electrode 24e facing away from one another, in particular and/or partly centrically in floor electrode 24e. Two of the six diffusion blocking elements 56e are each situated centrically on floor electrode 24e for a blocking of a direct electrical, in particular diffusive, path 50e that runs centrically through floor electrode 24e. In particular, the two of the six diffusion blocking elements 56e are made with a convex rounding, viewed from a contact opening 36e. In particular, four of the six diffusion blocking elements 56e are made with a concave rounding, viewed from contact opening 36e. The four of the six diffusion blocking elements 56e form respective oppositely situated pairs on floor electrode 24e, in order to form an electrical path 50e that runs centrically through floor electrode 24e. In particular, the two of the six diffusion blocking elements 56e, viewed from contact opening 36e, are each situated in front of one of the pairs formed by the four of the six diffusion blocking elements 56e, in particular for a blocking of a direct electrical, in particular diffusive, path 50e, 58e that runs centrically through floor electrode 24e.

Diffusion blocking elements 56e extend perpendicular to a receptacle surface 20e of bearer substrate 12e, through the entire floor electrode 24e. Diffusion blocking elements 56e extend in a plane of receptacle surface 20e of bearer substrate 12e, through at least 40% of the electrode, in particular floor electrode 24e.

Diffusion blocking elements 56e form electrical path 50e in a labyrinthine manner. Diffusion blocking elements 56e form in particular diffusive path 58e in a labyrinthine manner.

Figure 3A:
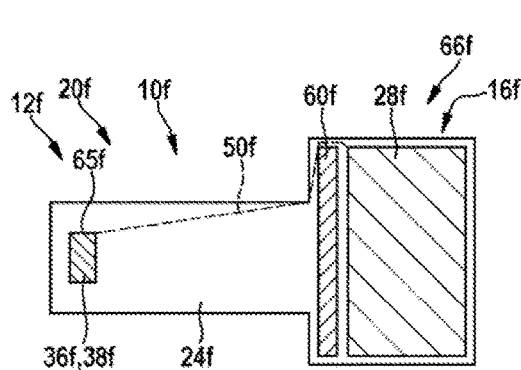
FIGS. 3a-3c show overviews of alternative microelectronics devices according to example embodiments of the present invention, in a schematic representation.

FIG. 3a schematically shows an alternative microelectronics device 10f.

A diffusion blocking element 60f, in particular at a distance from a piezo element 28f, is situated on an electrode, in particular on a floor electrode 24f. Microelectronics device 10f has diffusion blocking element 60f. Diffusion blocking element 60f is fashioned as a diffusion absorbing element. Diffusion blocking element 60f is situated in a region close to piezo element 28f on floor electrode 24f.

Diffusion blocking element 60f extends perpendicular to a receptacle surface 20f of bearer substrate 12f, through at least 50% of the electrode, in particular floor electrode 24f. Diffusion blocking element 60f extends perpendicular to a receptacle surface 20f of bearer substrate 12f, through the entire floor electrode 24f. Diffusion blocking element 60f extends in a plane of receptacle surface 20f of bearer substrate 12f, through at least 75%, in particular at least 90%, of the electrode, in particular of floor electrode 24f.

Diffusion blocking element 60f forms an electrical path 50f in a labyrinthine manner. Electrical path 50f connects in particular a contact surface 38f to piezo element 28f. Electrical path 50f is longer than a minimum geometrical distance of at least one contact opening 36f to the at least one piezo element 28f.

Diffusion blocking element 60f is made of the same material as piezo element 28f, in particular of a PZT material or a KNN material.

Figure 3B:
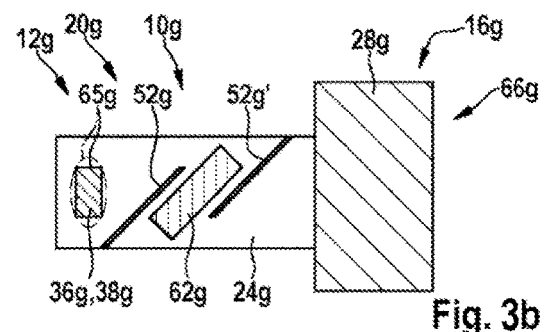

FIG. 3b schematically shows an alternative microelectronics device 10g.

Microelectronics device 10g is for the most part realized analogous to microelectronics device 10c. Therefore, in the following only the differences are described. In particular, microelectronics device 10g includes a further diffusion blocking element 62g that is situated in particular on a floor electrode 24g. Further diffusion blocking element 62g is fashioned as a diffusion absorbing element. Further diffusion blocking element 62g is situated in a region close to, in particular between, two diffusion blocking elements 52g, 52g' fashioned as openings.

Diffusion blocking element 62g is made of the same material as a piezo element 28g, in particular of a PZT material or a KNN material. Diffusion blocking element 62g is situated between a contact opening 36g, in particular contact surface 38g, and piezo element 28g.

Figure 3C:
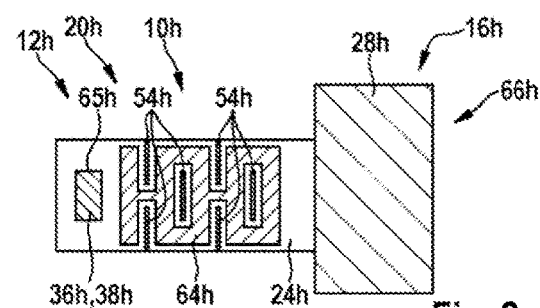

FIG. 3c schematically shows an alternative microelectronics device 10h.

Microelectronics device 10h is for the most part realized analogous to microelectronics device 10d. Therefore, in the following only differences are described. In particular, microelectronics device 10h includes a further diffusion blocking element 64h that is situated in particular on a floor electrode 24h. Further diffusion blocking element 64h is fashioned as a diffusion absorbing element. Further diffusion blocking element 64h is situated in a region close to, in particular between, six diffusion blocking elements 54h fashioned as openings. Further diffusion blocking element 64h extends from a region close to a contact opening 36h, in particular a contact surface 38h, to a region close to a piezo element 28h. Further diffusion blocking element 64h extends partly around diffusion blocking elements 54h fashioned as openings.

Diffusion blocking element 64h is made of the same material as piezo element 28h, in particular of a PZT material or a KNN material. Diffusion blocking element 64h is situated between contact opening 36h, in particular contact surface 38h, and piezo element 28h.

Figure 4A:
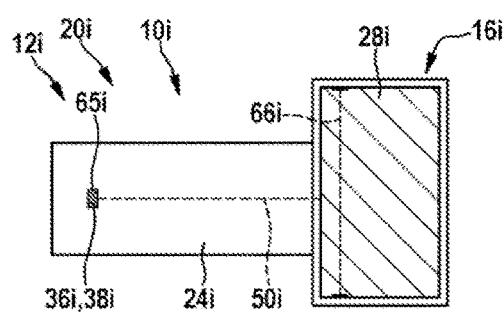
FIGS. 4a-4c shows overviews of alternative microelectronics devices according to example embodiments of the present invention, in a schematic representation.

FIG. 4a schematically shows an alternative microelectronics device 10i. Microelectronics device 10i is free of a diffusion blocking element, in particular on a floor electrode 24i. A length of an electrical path 50i from at least one contact opening 36i to piezo element 28i corresponds to at least twice the circumference 65i of contact opening 36i, in particular at least to a maximum width 66i of the at least one piezo element 28i. A contact surface 38i is at most as large as one one-thousandth, in particular one two-thousandth, of a surface of the at least one piezo element 28i, in particular perpendicular to a bearer substrate 12i.

Figure 4B:
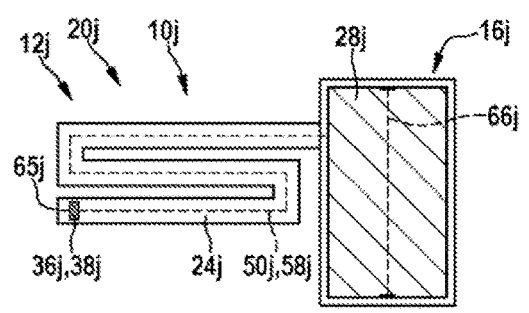
Figure 4C:
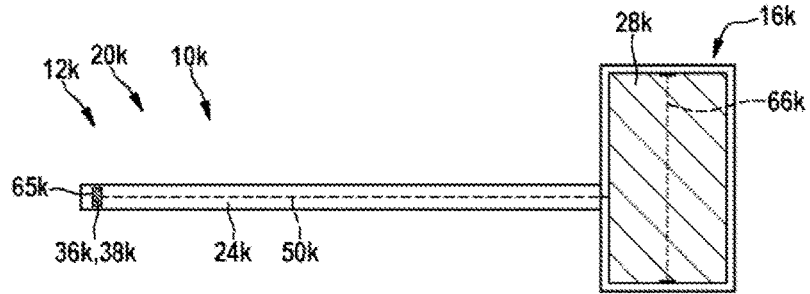

FIG. 4b schematically shows an alternative microelectronics device 10j. Microelectronics device 10j is free of a diffusion blocking element, in particular on a floor electrode 24j. A length of an electrical path 50j from at least one contact opening 36j to a piezo element 28j corresponds to at least twice the circumference 65j of contact opening 36j. A length of an electrical path 50j from at least one contact opening 36j to a piezo element 28j corresponds to at least two times, in particular three times, the maximum width 66j of the at least one piezo element 28j.

A contact surface 38j is at most as large as one one-thousandth, in particular one two-thousandth, of a surface of the at least one piezo element 28j, in particular perpendicular to a bearer substrate 12j. Contact surface 38j is in particular parallel to a receptacle surface 20j of bearer substrate 12j, in particular in all exemplary embodiments. Floor electrode 24j is formed by a plurality of partial segments that divert the electrical, in particular diffusive, path 50j, 58j, in particular multiple times.

FIG. 5c schematically shows an alternative microelectronics device 10k. Microelectronics device 10k is free of a diffusion blocking element, in particular on a floor electrode 24k. A length of an electrical path 50k from at least one contact opening 36k to a piezo element 28k corresponds to at least twice the circumference 65k of contact opening 36k. A length of an electrical path 50k from at least one contact opening 36k to a piezo element 28k corresponds to at least two times, in particular three times, the maximum width 66k of the at least one piezo element 28k. A contact surface 38k is at most as large as one one-thousandth, in particular one two-thousandth, of a surface of the at least one piezo element 28k, in particular perpendicular to a bearer substrate 12k. Floor electrode 24k is formed by a partial segment that forms electrical path 50k as a straight path.

The features of the individual exemplary embodiments may be combined to form further exemplary embodiments.

What is claimed is:

1. A microelectronics device, comprising:
   at least one bearer substrate; and
   at least one layered piezo stack situated on the bearer substrate, the piezo stack having at least one piezo element and at least one electrode; and
   at least one contact opening situated on the at least one electrode;
   wherein:
   the microelectronics device has at least one diffusion blocking element that is situated on the at least one electrode at least partly at a distance from the piezo element, and/or
   the at least one contact opening forms a contact surface that is at most as large as one one-thousandth of a surface of the at least one piezo element, and/or
   a length of an electrical path from the at least one contact opening to the at least one piezo element corresponds to at least twice a circumference of the at least one contact opening.

2. The microelectronics device as recited in claim 1, wherein the microelectronics device is a thin-film electronics device.

3. The microelectronics device as recited in claim 1, wherein the at least one layered piezo stack is a pyramidally layered piezo stack.

4. The microelectronics device as recited in claim 1, wherein the at least one electrode is a floor electrode.

5. The microelectronics device as recited in claim 1, wherein the microelectronics device has the at least one diffusion blocking element, and wherein the at least one diffusion blocking element is a slit-shaped opening.

6. The microelectronics device as recited in claim 1, wherein the microelectronics device has the at least one diffusion blocking element, and wherein the at least one diffusion blocking element is a diffusion absorbing element.

7. The microelectronics device as recited in claim 1, wherein the microelectronics device has the at least one diffusion blocking element, and wherein the at least one diffusion blocking element includes at least two diffusion blocking elements situated on the electrode at a distance from one another.

8. The microelectronics device as recited in claim 7, wherein the at least two diffusion blocking elements form an electrical path in a labyrinthine manner from the at least one contact element to the at least one piezo element.

9. The microelectronics device as recited in claim 1, wherein the microelectronics device has the at least one diffusion blocking element, and wherein the at least one diffusion blocking element extends perpendicular to a receptacle surface of the bearer substrate through at least 50% of the at least one electrode.

10. The microelectronics device as recited in claim 1, wherein the microelectronics device has the at least one diffusion blocking element, and wherein the at least one diffusion blocking element is made at least partly of the same material as the at least one piezo element.

11. The microelectronics device as recited in claim 1, wherein the microelectronics device has the at least one diffusion blocking element, and wherein the at least one diffusion blocking element is made at least partly rounded.

12. The microelectronics device as recited in claim 1, wherein a length of an electrical path from the at least one contact opening to the at least one piezo element is longer than a minimum geometrical distance of the at least one contact opening to the at least one piezo element.

13. A method for a production of a microelectronics device, comprising:
   providing a microelectronics device, including:
   at least one bearer substrate, and
   at least one layered piezo stack situated on the bearer substrate, the piezo stack having at least one piezo element and at least one electrode, and
   at least one contact opening situated on the at least one electrode;

wherein:
the method further comprises forming at least one diffusion blocking element on the at least one electrode at least partly at a distance from the piezo element; and/or the at least one contact opening forms a contact surface that is at most as large as one one-thousandth of a surface of the at least one piezo element; and/or a length of an electrical path from the at least one contact opening to the at least one piezo element corresponds to at least twice a circumference of the at least one contact opening.

\* \* \* \* \*